United States Patent [19]

Safabakhsh et al.

[11] Patent Number: 5,595,328

[45] Date of Patent: Jan. 21, 1997

[54] SELF ISOLATING ULTRASONIC TRANSDUCER

[75] Inventors: Ali R. Safabakhsh, Yardley; Valery Khelemsky, Holland; Charles S. Kulicke, Fort Washington, all of Pa.

[73] Assignee: Kulicke and Soffa Investments, Inc., Wilmington, Del.

[21] Appl. No.: 361,736

[22] Filed: Dec. 23, 1994

[51] Int. Cl.⁶ .................................................. B23K 20/10
[52] U.S. Cl. ................................................................ 228/1.1
[58] Field of Search ................................. 228/1.1; 29/525

[56] References Cited

U.S. PATENT DOCUMENTS 3,302,277  2/1967  Pruden et al. ............................ 228/1.1

5,364,005  11/1994  Whelan et al. ............................ 228/1.1
5,385,288  1/1995  Kyomasu et al. ........................ 228/1.1

*Primary Examiner*—P. Austin Bradley
*Assistant Examiner*—Jeffrey T. Knapp
*Attorney, Agent, or Firm*—John B. Sowell

[57] ABSTRACT

A low mounting impedance ultrasonic transducer for mounting on a bonding machine comprises a prior art type transducer having a modified mounting flange which includes one or more elongated apertures in the mounting flange or the transducer body to isolate transverse radial stress in the transducer body from entering into the mounting flanges and coupling to the bonding machine.

14 Claims, 3 Drawing Sheets

NODE PLACEMENT WINDOW
− 0 +

5,595,328

SELF ISOLATING ULTRASONIC TRANSDUCER

BACKGROUND OF THE INVENTION

1. Field of the Invention

The present invention relates to ultrasonic transducers of the type employed on automatic wire bonders. More specifically, the present invention relates to self isolating mounting structures for mounting ultrasonic transducers onto automatic wire bonders with a minimum loss of energy.

2. Description of the Prior Art

Ultrasonic transducers have been used in the semiconductor industry on automatic wire bonders used to make fine wire bonds that connect pads on semiconductor devices to lead frames or carriers. Heretofore it was known to manufacture a mounting flange for a transducer as an integral part of the transducer so that it would be precisely located at the theoretical node or zero displacement point of the transducer. This zero node would couple the least amount of energy into the automatic wire bonder on which it was mounted.

It has been observed that the impedance of individual transducers when mounted on different automatic wire bonders displayed different values of characteristic impedance $Z_M$. Heretofore, it was assumed that the coupling between the transducer mounting flange and the bonding head was the main cause of the change of this impedance $Z_M$ and that a tight coupling would eliminate the differences between transducers that were manufactured to identical specifications and tolerances.

A series of identical transducers were manufactured and tested to determine the type of mounting and/or coupling which would reduce the mounting impedance $Z_M$ and also provide uniform mounting impedance. These series of tests confirm that the coupling between mounted transducers varied such that large impedance changes were noted between the same transducer when mounted on different bonding heads.

It was further discovered that stress at the interface coupling played a large role in determining whether the coupling could be made tight and consistent so as to reduce the mounting impedance $Z_M$.

Heretofore prior art transducers were assembled using matched components to achieve a predetermined desired impedance and frequency. It was often necessary to assemble and reassemble components several times in order to achieve the desired results.

It would be desirable to provide a self isolating transducer that enabled the mounting flange to be tightly coupled to a bonding head and which reduces the bonding impedance and eliminates the impedance variations and differences that occur when a standard ultrasonic transducer is mounted on different bonding heads.

SUMMARY OF THE INVENTION

It is a primary object of the present invention to provide a novel zero node mounting structure for an ultrasonic transducer.

It is a primary object of the present invention to provide a novel stress relieved mounting structure for coupling an ultrasonic transducer to a bonding head with neglible change in the mounting impedance between bonding heads.

It is a primary object of the present invention to provide a novel zero node mounting flange for an ultrasonic transducer that is provided with slotted apertures in between the transducer body and the mounting flange.

It is a another object of the present invention to provide a novel shaped transducer horn having recesses or slots in the sides of the mounting flange opposite the transducer body intermediate the mounting bolts.

It is a another object of the present invention to provide a novel zero node mounting structure for an ultrasonic transducer having stress relieving apertures in the mounting flanges which reduce the mounting impedance to a predictable and consistent low impedance which in turn increases the yield of acceptable ultrasonic transducers when assembled.

It is a another object of the present invention to provide a novel structural beam shaped transducer having stress relieved apertures in the mounting flanges which reduces the mounting impedance and increases the stiffness of the transducer body.

As a general object of the present invention to provide a novel transducer and mounting flange structure that is produced at lower cost and results in higher yields.

It is a general object of the present invention to provide a novel transducer structure that reduces assembly time.

It is a general object of the present invention to provide a novel transducer that produces more consistent bonds and which maintains its load impedance when the bonding capillary is changed.

According to these and other objects of the present invention there is provided a self isolating ultrasonic transducer having a body with a driver at one end and a bonding capillary mounting recess at the other end. A mounting flange is attached to the body at a zero node between the driver and the capillary mounting recess. Stress and impedance isolating apertures are provided in the mounting flange opposite the transducer body which increased the placement window of the node location and lowers the mounting impedance.

DESCRIPTION OF THE PREFERRED EMBODIMENTS

Figure 1:
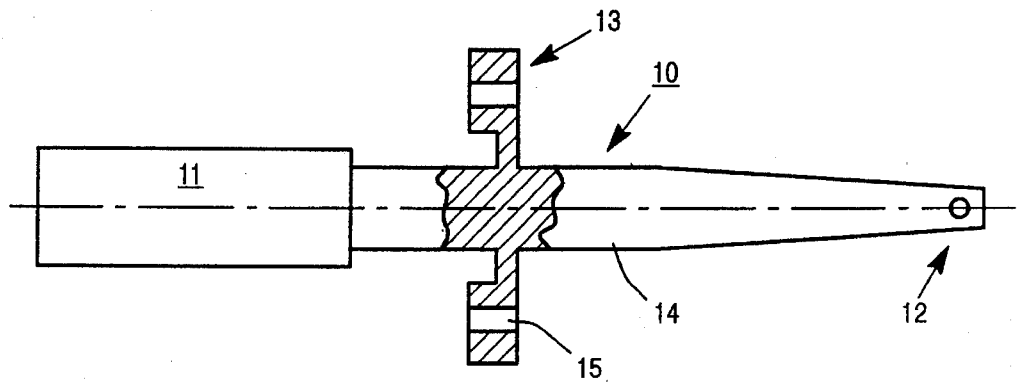
FIG. 1 is a plan view in partial section of a prior art ultrasonic transducer.

Refer now to FIG. 1 showing a typical prior art transducer 10 comprising a driver portion 11 at one end and a capillary mounting recess 12 at the other end. A mounting flange 13 is shown connected at a zero node to the body or horn 14 of the transducer 10. The mounting flange 13 is provided with mounting holes 15 for mounting the transducer 10 onto a bonding head (not shown).

Figure 2:
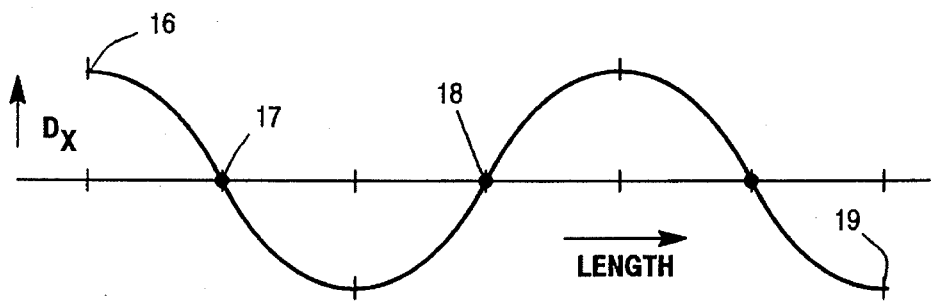
FIG. 2 is a waveform of displacement versus length of the transducer shown in FIG. 1.

Refer now to FIG. 2 showing a waveform of displacement in the X direction versus the length of the transducer shown in FIG. 1. The anti-node 16 represents a point at the end of the driver 11 which incurs the maximum displacement. The center of the driver 11 coincides with a node 17 which has substantially zero displacement. The mounting flange node 18 occurs at the connection of the mounting flange 13 to the body or horn 14. This zero node may be imperially calculated for purposes of manufacture, however, as a result of variations in the assembly and the components and the material of the body, this node point 18 is known to vary or shift substantially. In fact it is possible that the node 18 may shift so far that it is necessary to disassemble the components and select matching components for reassembly purposes. The anti-node 19 coincides with the capillary recess 12 and provides the maximum displacement of the bonding capillary (not shown).

Figure 3:
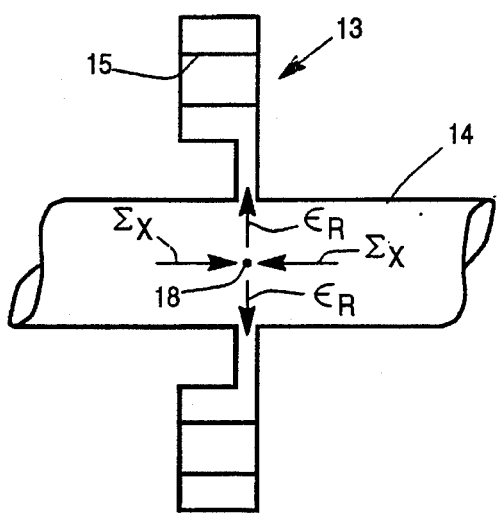
FIG. 3 is an enlarged view of the mounting flange of the transducer shown in FIG. 1 showing the direction of stress and strain at the mounting node.

Refer now to FIG. 3 showing an enlarged view of the mounting flange 13 connected to the body or horn 14. A node point 18 at the center of the body 14 is shown having stress ($\Sigma_x$) directed toward the node point 18 which causes both stress and strain ($\epsilon_R$) in the radial direction. It is this stress and strain in the radial direction which is transferred into the mounting flange and thus transfers power from the transducer into the bonding head on which the mounting flange 13 is attached. It was found during a series of tests that the amount of power that is absorbed by the bonding head on which the mounting flange is attached, varies from bonding head to bonding head and is completely unpredictable and random. Thus, when a plurality of identically manufactured transducers were attached to different bonding heads, it was found that the mounting impedance varied so greatly that only 50% of the transducers passed inspection tests of three ohms on all of the bonding heads. As will be explained hereinafter, the present invention ultrasonic transducer and novel mounting flange were attached to the same bonding heads. All of the ultrasonic transducers passed inspection and as having less than 3 ohms mounting ($Z_M$) impedance and showed little variation of impedance when mounted on different bonding heads.

Figure 4:
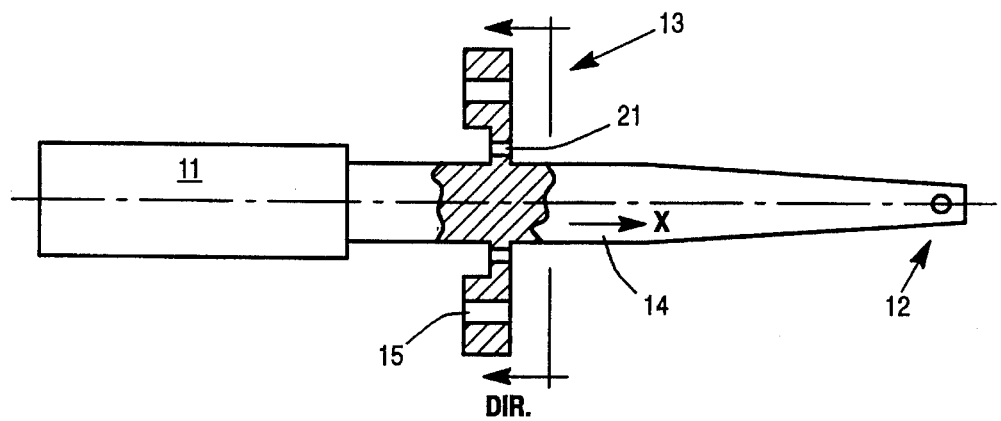
FIG. 4 is a plan view in partial section of the present invention stress relieved ultrasonic transducer and a novel mounting flange.

Refer now to FIG. 4 showing a plan view in partial section of the present invention stress relieved ultrasonic transducer 10 which comprises a driver portion 11, a capillary recess mounting portion 12 and a mounting flange 13 attached to a body 14. The mounting flange 13 is shown having stress relieving apertures 21 intermediate the mounting holes 15 of the mounting flange 13 and the body 14. As will be explained in detail hereinafter, when observing the mounting flange in the direction shown by the arrows, the stress relieving apertures 21 may be made in several different desirable configurations.

Figure 5:
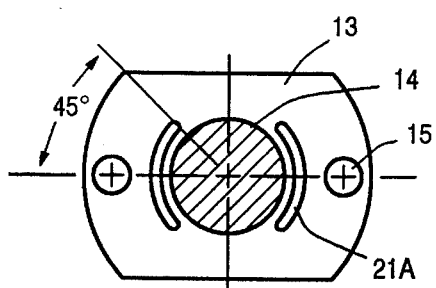
FIG. 5 through 10 are all sections in elevation of different mounting flanges showing stress relieving apertures of different shapes when looking at the transducer of FIG. 4 in the direction indicated.

Refer now to FIGS. 5 through 10 showing elevations in sections taken through the body of the transducer 13 shown in FIG. 4 and showing different shaped stress relieving apertures. In FIG. 5 the section in elevation is cut through a solid body 14 having stress relieving apertures 21A intermediate to the body 14 and the mounting holes 15. The stress relieving apertures 21A are made in the form of sectors of an annular ring surrounding the body 14. The length of the sectors may be from 70 to 90 degrees on either side of the body 14.

Figure 6:
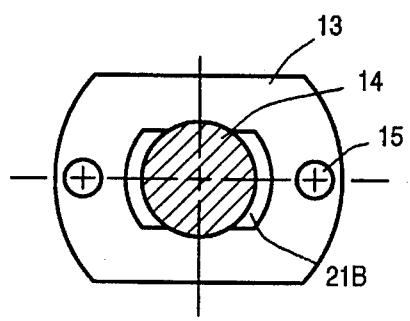

In FIG. 6 the sectors 21B encompass the same radial dimension but are made completely open to the horn or body 14. Otherwise the stress relieving apertures are similar to those shown in FIG. 5.

Figure 7:
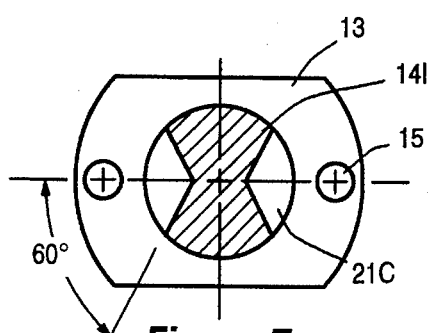

In FIG. 7 the stress relieving apertures 21C are made in a segment shape between the mounting flange 13 and a I beam shaped transducer or body 14I. The sector 21C forming the stress relieving aperture has been found to be able to be increased up to 120 degrees and made as small as 70 degrees. By increasing the angle of the sector, the rotational moment of inertia of the body 14I may be increased while preserving the inertia mass of the body 14I. Thus, the novel I beam shaped transducer body 14I ultrasonic transducer may be made interchangeable with the other ultrasonic transducers shown and described with reference to FIGS. 5 through 10.

Figure 8:
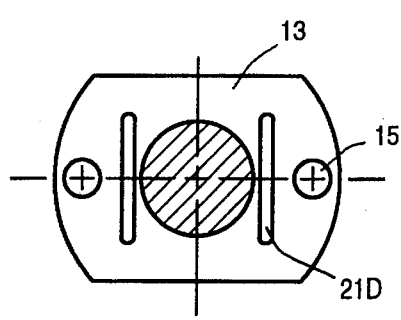

In FIG. 8 the stress relieving apertures 21D are shown as elongated slots which are easier to manufacture and achieve substantially the same results achieved by the transducers described with reference FIGS. 5 through 7.

Figure 9:
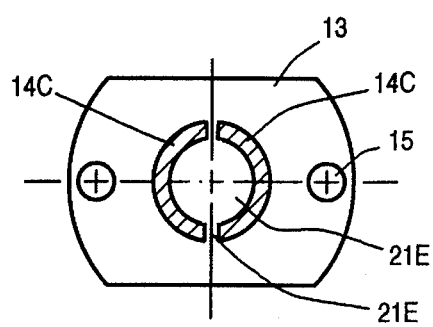

In FIG. 9 the transducer body or horn 14 is made hollow at the point represented by the mounting flange node 18. Thus, the crescent shaped body portions 14C are attached to the mounting flange 13 and the aperture 21E includes a hollow portion with slots between the crescent shaped portions 14C.

Figure 10:
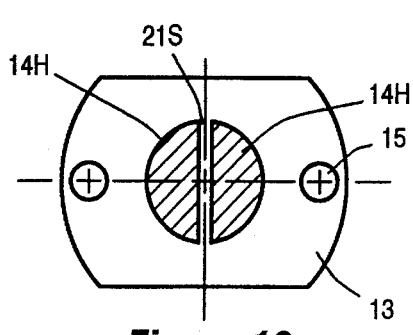

In FIG. 10 the crescent shaped portion 14H shown in FIG. 9 is substantially hemispherical shaped as shown at 14H divided by a single slot 21S.

In all of the aforementioned mounting flanges 13 there is provided stress relieving apertures somewhere between the mounting holes 13 and the body 14 of the transducer.

Figure 11:
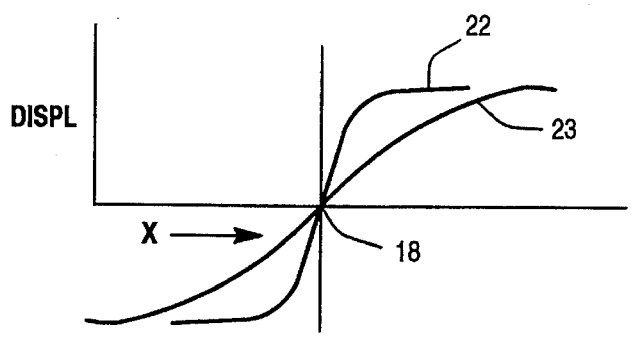
FIG. 11 is a one-quarter wave length waveform of displacement versus length of the FIG. 4 transducer at the mounting flange node.

Refer now to FIG. 11 showing a one-quarter wave length waveform of displacement versus length for the present invention transducer and for the prior art transducer. Displacement waveform 22 is shown having a sharp or high sloped displacement in relation to its length. In contrast thereto, the present invention waveform 23 has a lower slope displacement curve versus length from the node 18. As will be explained hereinafter, these slopes illustrate that the present invention transducer has less sensitivity to node placement of the mounting flange.

Figure 12:
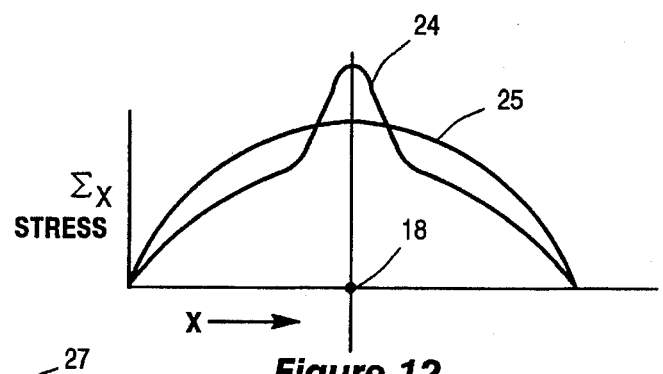
FIG. 12 is a schematic wave form of stress in an X direction of the transducer body versus length in the X direction at the mounting flange node.

Refer now to FIG. 12 showing a schematic waveform of the stress in X direction in the transducer body versus length in the X direction at the mounting flange node 18. The prior art transducer exhibited higher stress versus length at the node 18 as shown by waveform 24 than the present invention waveform 25 which exhibits no excessive build-up of stress at the node 18.

Figure 13:
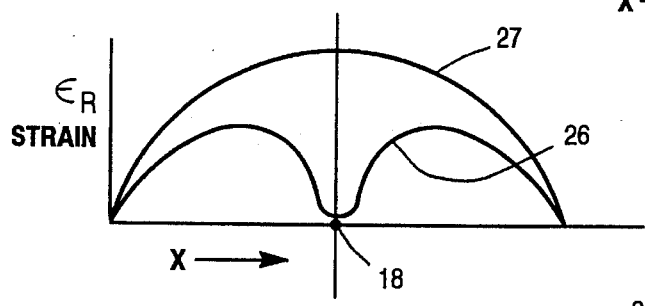
FIG. 13 is a schematic waveform of the strain in a radial direction in the transducer body verus length in the X direction at the mounting flange node.

Refer now to FIG. 13 showing a schematic waveform of strain in the radial direction of the transducer body versus length in the X direction at the mounting flange node 18. The waveform 26 shows strain in the radial direction of the prior art transducer exhibits a sharp drop at the node mounting point 18 even though the stress as shown in waveform 24 is excessive compared to the present invention. The suppression of strain in the body results stress at the mounting flange on the bonding head at the mounting holes 15. In contrast thereto, the present invention waveform 27 shows that the strain in the body of the transducer need not be suppressed in any manner because the mounting flange 13 is isolated from the transducer body at the point of maximum strain.

In summary, FIGS. 11 through 13 clearly illustrate that the stress and strain at the node 18 of the body 14 of the transducer 10 is not limited but is isolated from entering the mounting flange 13 so that it would be transferred to the mounting holes 15 and into the bonding head to which it is attached. By isolating the stress conditions which affect the mounting impedance $Z_M$ of the transducer 10, it is possible to produce transducers of uniform impedance for purposes of mounting on different bonding heads.

Figure 14:
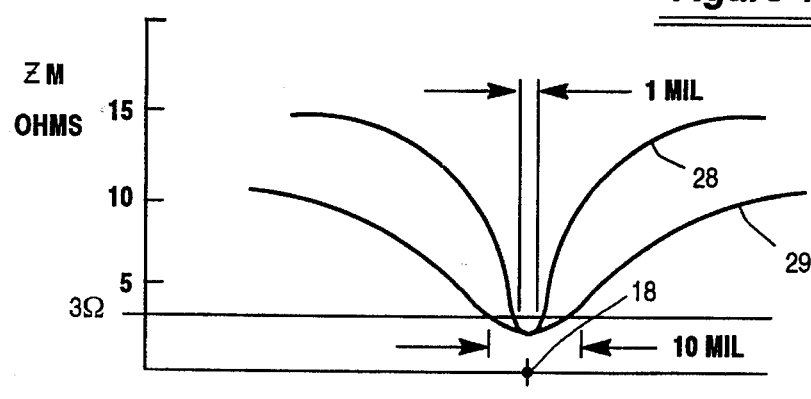
FIG. 14 is a schematic waveform diagram showing the improved mounting flange node placement window of the present invention.

Refer now to FIG. 14 showing a schematic waveform diagram of the improved mounting flange node placement window of the present invention. Waveform 28 shows that if the flange 13 placed at the actual node 18, the mounting impedance is below 3 ohms. However, any deviation of more than 1 mil in the X direction will cause the mounting impedance $Z_M$ to increase appreciably up to approximately 15 ohms. In contrast thereto, the present invention waveform 29 clearly illustrates that the mounting window in which the actual placement of the flange at the actual node may vary plus or minus 5 mils forming a placement window of 10 mils and still remain below 3 ohms. Thus, it will be understood that there is a distinct advantage in employing the novel stress relieved flange because the placement of the flange at the actual or theoretical node is no longer critical.

Figure 15:
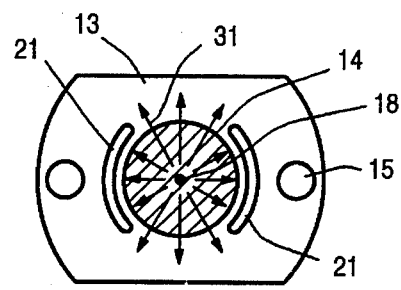
FIG. 15 is a schematic diagram showing pressure wave vectors in a radial direction being isolated by the present invention stress relieving apertures in the mounting flange.

Refer now to FIG. 15 showing a schematic diagram of pressure wave vectors 31 in a radial direction being isolated by the present invention stress relieving apertures 21. The vectors which occur in the horizontal direction and vectors of up to approximately 45 degrees therefrom, are isolated by the apertures 21 and do not enter into the flange 13. The vectors 31 which are substantially vertical pass into the flange 13 and are reflected back into the body of the transducer 14 without power loss.

Having explained a preferred embodiment of the present invention and a plurality of modifications showing different shapes of apertures which serve to isolate the transducer body from the mounting flange, it will be appreciated that the present invention solves numerous problems which existed in the prior art such as eliminating high precision ground washers, providing uniform impedance when the capillaries are changed, making assembly and production cheaper without having to match drivers to transducer bodies. The stress at the mounting holes is relieved so as to provide a transducer which has a consistent mounting impedance when mounted onto bonding heads having different random damping characteristics.

By changing the cross section shape of the body or horn 14 as shown in FIG. 7, it is possible to increase the bending strength of the transducer body while keeping the weight unchanged. This improvement permits the bonding head to move faster at higher acceleration rates without whip or bending of the transducer body or horn which would cause deviations from the intended motion profile of the bonding tip of the capillary mounted in the ultrasonic transducer. Whipping or bending of the transducer can cause overshoot or undershoot of motion and also causes changes in the bond force which are not desired.

Having explained FIGS. 14 and 15, it will be understood that the stress or pressure wave forces acting in the transverse direction between mounting holes 15 are isolated from the mounting holes and decoupled from stress and pressure waves which occur axially in the X direction along the transducer body 11. This decoupling action results in the low mounting impedance shown and described with reference to FIG. 14. Further, when the mounting flange 13 is made as a separate piece, the actual zero mounting node 18 may be first determined before the flange 13 is mounted at the axial node rather than the theoretical node. An interference fit is preferred assuring that the components of the transducer all are assembled the first time in an optimum composite ultrasonic transducer 10 having low mounting impedance.

What is claimed is:

1. A method of making an ultrasonic transducer with a substantially uniform low mounting impedance $Z_M$, comprising the steps of:

making a transducer body for assembly with a driving device, providing a bonding tool recess at an anti-node end of said transducer body, connecting a rigid mounting flange at a zero mounting node of said transducer body, providing mounting holes in the outer portion of said mounting flange, and providing stress relieving slot means in said transducer body, whereby radial stress waves built up at said zero mounting node are isolated from said mounting holes by said stress relieving slot means reducing the mounting impedance $Z_M$.

2. The method as set forth in claim 1 wherein the step of providing stress relieving slots comprises cutting a slot through said transducer body at said zero mounting node, and the step of providing a mounting flange at said zero mounting node includes tightly fitting the mounting flange over the slot in said transducer body.

3. A low mounting impedance ultrasonic transducer, comprising:

a transducer body, an ultrasonic driver at one end of said transducer body, a bonding tool mounting recess at the other end of said transducer body, a mounting flange directly connected to over fifty percent of said transducer body and forming a rigid connection therewith at a zero mounting node intermediate the ends of said transducer body, a plurality of mounting holes in said mounting flange for mounting said transducer body on a bonding machine, and a pair of stress relieving slots between said transducer body and said mounting holes for relieving radial pressure waves that are directed toward said mounting holes and for providing a uniformly low mounting impedance $Z_M$.

4. An ultrasonic transducer as set forth in claim 3 wherein said pair of slots comprise segment shaped slots in said mounting flange.

5. An ultrasonic transducer as set forth in claim 3 wherein said pair of slots in said mounting flange are elongated in a vertical direction.

6. An ultrasonic transducer as set forth in claim 3 wherein said pair of slots are each included in an angle of the circumference of said transducer body of between approximately 70° to 90°.

7. A low mounting impedance ultrasonic transducer, comprising:

a transducer body, an ultrasonic driver at one end of said transducer body, a bonding tool mounting recess at the other end of said transducer body, a mounting flange connected to said transducer body at a zero mounting node intermediate the ends of said transducer body, a plurality of mounting holes in said mounting flange for mounting said transducer body on a bonding machine, and stress relieving aperture means located in said transducer body between said mounting holes for relieving radial pressure waves directed toward said mounting holes.

8. An ultrasonic transducer as set forth in claim 1 wherein said stress relieving aperture means comprises a slot through the center of said transducer body.

9. An ultrasonic transducer as set forth in claim 1 wherein said aperture means comprises two slots in said transducer body at said zero node.

10. An ultrasonic transducer as set forth in claim 7 wherein said stress reliving aperture means comprises a pair of slots located in the sides of said transducer body.

11. An ultrasonic transducer as set forth in claim 7 wherein the theoretical zero mounting node may differ from the actual zero mounting node by up to ±5 mils at less than three ohm mounting impedance $Z_M$.

12. An ultrasonic transducer as set forth in claim 7 where the stiffness of said mounting flange connected to said transducer body is increased by increasing the thickness of said mounting flange.

13. An ultrasonic transducer as set forth in claim 1 wherein said transducer body in cross sectional elevation is deeper in height than in width to provide a stiffer body than a round horn transducer.

14. An ultrasonic transducer as set forth in claim 13 wherein said transducer body is hourglass in shape to provide an I-beam type stiff transducer body.

\* \* \* \* \*